(12) United States Patent
Bartlett et al.

(10) Patent No.: US 8,723,530 B2
(45) Date of Patent: *May 13, 2014

(54) SIGNAL ACQUISITION SYSTEM HAVING REDUCED PROBE LOADING OF A DEVICE UNDER TEST

(71) Applicant: Tektronix, Inc., Beaverton, OR (US)

(72) Inventors: Josiah A. Bartlett, Forest Grove, OR (US); Ira G. Pollock, Hillsboro, OR (US); Daniel G. Knierim, Beaverton, OR (US); Lester L. Larson, Portland, OR (US); Scott R. Jansen, Beaverton, OR (US); Kenneth P. Dobyns, Beaverton, OR (US); Michael Duane Stevens, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/854,566

(22) Filed: Apr. 1, 2013

(65) Prior Publication Data

US 2013/0221985 A1 Aug. 29, 2013

Related U.S. Application Data

(60) Division of application No. 12/846,721, filed on Jul. 29, 2010, now Pat. No. 8,436,624, which is a continuation-in-part of application No. 12/571,236, filed on Sep. 30, 2009, now abandoned.

(51) Int. Cl.
*G01R 35/00* (2006.01)

(52) U.S. Cl.
USPC .................. 324/601; 324/750.02; 324/76.24; 702/107; 702/190

(58) Field of Classification Search
USPC .......................................................... 324/601
See application file for complete search history.

(56) References Cited

U.S. PATENT DOCUMENTS

| | | |
|---|---|---|
| 2,883,619 A | 4/1959 | Kobbe |
| 4,034,291 A | 7/1977 | Allen et al. |
| 4,260,951 A | 4/1981 | Lewyn |
| 4,397,549 A | 8/1983 | Morgan |
| 4,743,839 A | 5/1988 | Rush |
| 4,996,497 A | 2/1991 | Waehner |
| 5,172,051 A | 12/1992 | Zamborelli |
| 5,274,336 A | 12/1993 | Crook et al. |
| 5,472,561 A | 12/1995 | Williams et al. |
| 6,226,322 B1 | 5/2001 | Mukherjee |

(Continued)

OTHER PUBLICATIONS

McGovern, Patrick A., Nanosecond Passive Voltage Probes, IEEE Transactions on Instrumentation and Measurement, vol. IM-26, No. 1, Mar. 1977, pp. 46-52.

*Primary Examiner* — Melissa Koval
*Assistant Examiner* — Benjamin M Baldridge
(74) *Attorney, Agent, or Firm* — Marger Johnson & McCollom PC; Thomas F. Lenihan

(57) ABSTRACT

A signal acquisition system has a signal acquisition probe having probe tip circuitry coupled to a resistive center conductor signal cable. The resistive center conductor signal cable of the signal acquisition probe is coupled to a compensation system in a signal processing instrument via an input node and input circuitry in the signal processing instrument. The signal acquisition probe and the signal processing instrument have mismatched time constants at the input node with the compensation system providing pole-zero pairs for maintaining flatness over the signal acquisition system frequency bandwidth.

6 Claims, 11 Drawing Sheets

(56) References Cited

U.S. PATENT DOCUMENTS

| | | | |
|---|---|---|---|
| 6,307,363 B1 | 10/2001 | Anderson | |
| 6,347,288 B1* | 2/2002 | Trammell et al. | 702/107 |
| 6,483,284 B1 | 11/2002 | Eskeldson et al. | |
| 6,490,535 B1* | 12/2002 | Hansen | 702/107 |
| 6,710,959 B1 | 3/2004 | Iroaga | |
| 6,714,886 B2* | 3/2004 | Sung et al. | 702/107 |
| 6,801,868 B1* | 10/2004 | Medelius et al. | 702/107 |
| 6,856,126 B2 | 2/2005 | McTigue | |
| 6,864,761 B2 | 3/2005 | Eskeldson et al. | |
| 6,870,359 B1* | 3/2005 | Sekel | 324/750.02 |
| 7,257,505 B1* | 8/2007 | Kurylak et al. | 702/107 |
| 7,679,422 B1* | 3/2010 | Thiagarajan et al. | 327/337 |
| 8,278,940 B2 | 10/2012 | Bartlett | |
| 2003/0154045 A1* | 8/2003 | Sung et al. | 702/107 |
| 2004/0008043 A1 | 1/2004 | Thomas et al. | |
| 2004/0075510 A1 | 4/2004 | Eskeldson et al. | |
| 2004/0249485 A1 | 12/2004 | Bondarev et al. | |
| 2005/0134368 A1 | 6/2005 | Chandrasekaran | |
| 2005/0253651 A1 | 11/2005 | Quek | |
| 2007/0126501 A1* | 6/2007 | Kim et al. | 330/86 |
| 2007/0159196 A1 | 7/2007 | Hayden et al. | |
| 2008/0048778 A1 | 2/2008 | Lee et al. | |
| 2009/0134893 A1 | 5/2009 | Frame et al. | |
| 2010/0007419 A1 | 1/2010 | Gilbert | |
| 2010/0042338 A1 | 2/2010 | Giurgiutiu et al. | |
| 2011/0074389 A1 | 3/2011 | Knierim | |
| 2011/0074392 A1 | 3/2011 | Bartlett | |
| 2011/0074441 A1 | 3/2011 | Bartlett | |

\* cited by examiner

SIGNAL ACQUISITION SYSTEM HAVING REDUCED PROBE LOADING OF A DEVICE UNDER TEST

CROSS REFERENCE TO RELATED APPLICATIONS

This application is a division of U.S. patent application Ser. No. 12/846,721, filed Jul. 29, 2010, now U.S. Pat. No. 8,436,624, which is a continuation-in-part of U.S. application Ser. No. 12/571,236, filed Sep. 30, 2009, now abandoned, herein incorporated by reference.

BACKGROUND OF THE INVENTION

The present invention relates generally to acquiring a signal from a device under test and more particularly to a signal acquisition system having reduced loading of the device under test using a signal acquisition probe with reduced capacitance.

Traditional passive voltage probes 10 generally consist of a resistive-capacitive parallel network 12 at the probe tip 14, shown as $R_T$ and $C_T$ in FIG. 1, coupled via a resistive center conductor signal cable 16 to compensation circuitry 18 in a compensation box. The compensation circuitry 18 has resistive elements $R_{C1}$ and $R_{C2}$ and capacitive element $C_C$. $R_{C1}$ is in series with the cable 16 and $R_{C2}$ is in series with variable capacitor $C_C$. The compensation circuitry 18 is coupled to input circuitry 20 of a measurement test instrument 22, such as an oscilloscope, spectrum analyzer, logic analyzer and the like. Generally, the input circuitry 20 of an oscilloscope includes an input resistive-capacitive network 24, shown as $R_{TS}$ and $C_{TS}$, that is associated with switching input attenuation circuitry (not shown) that provides an input impedance for the oscilloscope of 1 MΩ in parallel with 10 to 20 picofarad (pf) of capacitance. The output of the switching input attenuation circuitry is coupled to the input of a preamplifier 26. The oscilloscope is calibrated to provide a nominally flat frequency response transfer function from the input of the oscilloscope to the output of the preamplifier.

The compensation circuitry 18 provides resistive and capacitive termination of the cable 16 to minimize reflections and provides a transfer function having a nominally flat frequency response to the measurement test instrument 22. The variable compensation capacitor $C_C$ is user adjustable to match the capacitive and resistive divider ratios of the probe over variations in the input capacitance of individual oscilloscope channels. Resistive element $R_{C1}$ provides resistive cable 16 termination matching into the oscilloscope input at high frequencies (where cable $Z_0 \approx 155\Omega$). $R_{C2}$ in series with variable capacitor $C_C$ improves the cable termination into the capacitive load in the oscilloscope.

The tip resistance $R_T$, cable termination resistor $R_{C1}$ and the input resistance $R_{TS}$ form a voltage divider attenuation network for DC to low frequency input signals. To accommodate a wide frequency range of input signals, the resistive voltage divider attenuation network is compensated using a shunt tip capacitor $C_T$ across the tip resistive element $R_T$ and a shunt termination capacitor $C_C$ and the input capacitor $C_{TS}$ across termination resistive element $R_{TS}$. To obtain a properly compensated voltage divider, the time constant of the probe tip resistive-capacitive parallel network 12 must equal the time constant of the termination resistive-capacitive parallel network 24 including $C_{cable}$ and $C_C$.

Properly terminating the resistive cable 16 in its characteristic impedance requires adding a relatively large shunt capacitance $C_C$ to the compensation network 18. This is in addition to the bulk cable capacitance $C_{CABLE}$. For example, the tip resistance $R_T$ and capacitance $C_T$ for a P2222 10× Passive Probe, manufactured and sold by Tektronix, Inc., Beaverton, Oreg., is selected to give a 10× divide into the oscilloscope's input impedance of 1 MΩ. The minimum tip capacitance $C_T$, neglecting any other parasitic capacitance, is one ninth of the sum of the cable bulk capacitance $C_{CABLE}$, $C_C$ and $C_{TS}$. The tip capacitance of $C_T$ is on the order of 8 pF to 12 pf for the above stated parameters. The input capacitance (which is $C_T$ in series with the sum of $C_{CABLE}$, $C_C$ and $C_{TS}$) is driven by the circuit being monitored and therefore represents a measure of how much the probe loads the circuit.

FIG. 2 illustrates another passive voltage probe and oscilloscope configuration where the preamplifier 28 is configured as a current amplifier. This configuration has the same limitations as the probe and oscilloscope configuration of FIG. 1. The probe has compensation circuitry in the probe compensation box and the oscilloscope has the traditional 1 MΩ resistance in parallel with 10 to 20 pf of capacitance at the oscilloscope input. A major drawback to existing passive voltage probe and oscilloscope configurations is that a substantial portion of the mid-band and high-band frequency signal current at the output of the resistive center conductor signal cable is shunted to ground by the termination capacitor $C_C$. In addition, since the resistive center conductor signal cable is terminated prior to the oscilloscope input, the parasitic capacitance of the input circuitry of the oscilloscope acts as a non-terminated transmission line which shunts additional current to ground.

The probe tip capacitance and the resistive center conductor signal cable affect the overall bandwidth of a traditional passive probe. Further, the probe tip input presents low input impedance to a device under test at high frequencies due to the low capacitive reactance in parallel with the high input resistance. Reducing the probe tip capacitance to increase the capacitive reactance requires adjustment of the other component values of the voltage divider network to maintain a compensated network. Previously, this has been accomplished by increasing the resistance in the probe tip. However, this increases the divider ratio of the network with a resulting increase in the attenuation of signal applied to the probe. The decreased signal input to the oscilloscope may be compensated for by increasing the gain of the oscilloscope input circuits which results in an increase in the noise on the signal reducing the overall signal-to-noise ratio of the instrument.

A special type of passive probe exists that provides a relatively high impedance and attenuation into a 50 ohm input oscilloscope. The $Z_0$ probe has a relatively low input resistance, 5 kilo ohms or less, coupled to a 50 ohm lossless coaxial cable. The capacitance at the probe tip is generally less than 1 pf produced by the parasitic capacitance of the probe head. In a specific embodiment, the probe tip resistance is 450 ohm coupled via the 50 ohm lossless coaxial cable to the 50 ohm input of the oscilloscope, which produces a 10× passive voltage divider network. The voltage input to this probe is limited as compared to the traditional passive probe due to the size of the input resistor. Also, the low input resistance can cause excessive loading to DC signals.

U.S. Pat. No. 6,483,284, shown in FIG. 3, teaches a wideband probe using pole-zero cancellation. A parallel probe tip network of resistor $R_{tip}$ and capacitor $C_{tip}$ in series with resistor $R_{tab}$ and capacitor $C_{tab}$ detects a signal from a device under test and couples the signal to a compensation network via a near lossless coaxial cable 40. The capacitor $C_{tab}$ represents the capacitance in the tip circuit, such as a trace on a circuit board, a coaxial cable or the like. A cable termination resistor $R_e$ is connected in series between the cable 40 and an inverting input terminal of an operational amplifier 42. The non-inverting input is coupled to a common ground. Connected between the input terminal and the output terminal of the operational amplifier 42 is a parallel combination of a resistor $R_{fb}$ and a capacitor $C_{fb}$ with resistor $R_{Pk}$ in series with $C_{fb}$. The parallel tip resistor $R_{fp}$ and capacitor $C_{tip}$ create a zero and the combination of resistor $R_{tab}$ and capacitor $C_{tab}$ create a pole. A pole is created by resistor $R_{fb}$ and capacitor $C_{fb}$ in the compensation network and a zero is created by resistor $R_{Pk}$ and capacitor $C_{fb}$. The zero and pole created in the probe tip network are cancelled by the pole and zero in the compensation network. The output of the compensation network is coupled to an end user device, such as an oscilloscope or the like. The teaching states that the time constants of the two RC networks must be equal so that the zeros and poles balance out and the probe has a constant gain. Further, the operational amplifier 42 is part of the wideband probe circuitry and not part of the end user device.

SUMMARY OF THE INVENTION

Accordingly, the present invention is a signal acquisition system having a signal acquisition probe and a signal processing instrument. The signal acquisition probe has probe tip circuitry coupled to a resistive center conductor signal cable. The resistive center conductor signal cable is coupled to an input node of the signal processing instrument. The input node is further coupled to a compensation system disposed in the signal processing instrument via input circuitry. The signal acquisition probe and the signal processing instrument have mismatched time constants at the input node with the compensation system providing pole-zero pairs for maintaining flatness over the signal acquisition system frequency bandwidth.

The compensation system has an input amplifier and associated feedback loop circuitry coupled between an input and output of the input amplifier. The feedback loop circuitry may be configured with variable resistive and capacitive elements and the input amplifier may be configured as a current amplifier. The variable resistive and capacitive elements may be implemented with a plurality of registers for setting resistive values and capacitive values of respective resistive and capacitive elements. The feedback loop circuitry may be implemented with a resistive element, at least a first variable gain voltage source coupled in series with first series coupled resistive element and capacitive element, that are in parallel with the second and third series coupled resistive and capacitive elements. The feedback loop circuitry may also include a second variable gain voltage source coupled in series with the second series coupled resistive and capacitive elements.

The input circuitry of the signal processing instrument is preferably attenuation circuitry that provides at least one of resistive and capacitive termination of the resistive center conductor signal cable. The input node is coupled to a signal path that has the other end coupled to a resistive element disposed adjacent to the input of the input amplifier forming a terminated transmission line. A switching circuit is disposed in the signal processing instrument for selectively coupling the input node to the compensation system via the attenuation circuitry and for selectively coupling an additional resistive-capacitive attenuation network between the input node and the attenuation circuitry.

The probe tip circuitry has at least a first resistive element in parallel with a capacitive element. The probe tip circuitry may also have a plurality of first resistive elements in parallel with a plurality of capacitive elements to form a high voltage signal acquisition probe. The capacitive element or elements have an effective capacitance in the range of 2 to 5 picofarads.

A calibration process for the signal acquisition system includes the steps of acquiring digital values of a broad frequency content signal as a calibration waveform using the signal acquisition probe and the signal processing instrument, determining at least a first measured error value between a broad frequency content signal reference calibration waveform stored in the signal processing instrument and the calibration waveform at a common location on the waveforms, determining a measured error factor as a function of at least the first measured error value at the common location, and applying the measured error factor to a register value of an appropriate feedback loop register in a plurality of registers in feedback loop circuitry of an input amplifier of a compensation system. The measured error value and the measured error factor for each subsequent common location of the calibration waveform and the calibration reference waveform is then determined. Alternately, a plurality of first measured error values are determined between the broad frequency content signal reference calibration waveform stored in the signal processing instrument and the calibration waveform at common locations on the waveforms set by at least one of time locations and frequency locations, and a measured error factor is determined as a function of the plurality of first measured error values and the common locations on the waveforms. After the measured error value and the measured error factor has been determined for the last common location on the calibration waveform and the calibration reference waveform, a new set of digital values of a broad frequency content signal are acquired as the calibration waveform. The new calibration waveform is compared with calibration specifications to verify the calibration. If the calibration is within the calibration specifications, the register values in the plurality of registers in feedback loop circuitry of the input amplifier are stored and the successful result of the calibration process is displayed.

If the calibration waveform is not within the calibration specifications, then a determination is made on whether the calibration process has exceeded an iteration time limit value. If the calibration process has not exceeded an iteration time limit value, then the common location on the waveforms is set to the initial location. The measured error value or values and the measured error factor for each common location or locations of the calibration waveform and the calibration reference waveform is then determined. After the measured error value and the measured error factor have been determined for the last common location on the calibration waveform and the calibration reference waveform, a new set of digital values of a broad frequency content signal are acquired as the calibration waveform. The new calibration waveform is compared with calibration specifications to verify the calibration. If the new calibration waveform is still not within the calibration specifications and the calibration process has timed out, then the initial values in the plurality of registers in the feedback loop circuitry of the input amplifier prior to the calibration process are stored, and the unsuccessful result of the calibration process is displayed.

The acquiring of the digital values of the broad frequency content signal as the calibration waveform includes the additional steps of attaching the signal acquisition probe to the signal processing instrument. The signal processing instrument detects the presence or absence of a probe memory in the signal acquisition probe, and loads stored contents of probe memory into the signal processing instrument if the probe memory is present. The signal processing instrument detects the presence of probe calibration constants stored in the probe memory, and applies the probe calibration constants to appropriate register values in the plurality of registers in the feedback loop circuitry of the input amplifier. If the signal acquisition probe does not have a probe memory, then nominal register values are applied to the plurality of registers in the in feedback loop circuitry of the input amplifier.

The calibration process may be implemented in the frequency domain by converting the digital values of a broad frequency content signal calibration waveform to a frequency domain representation using a Fast Fourier Transform and determining a measured error value between a frequency domain representation of a broad frequency content signal reference calibration waveform stored in the signal processing instrument and the frequency domain representation of the calibration waveform at common frequency locations on the waveforms. The frequency domain representation of broad frequency content signal reference calibration waveform is stored as a frequency domain waveform.

The objects, advantages and novel features of the present invention are apparent from the following detailed description when read in conjunction with appended claims and attached drawings.

BRIEF DESCRIPTION OF THE DRAWING FIGURES

DESCRIPTION OF THE INVENTION

Figure 4:
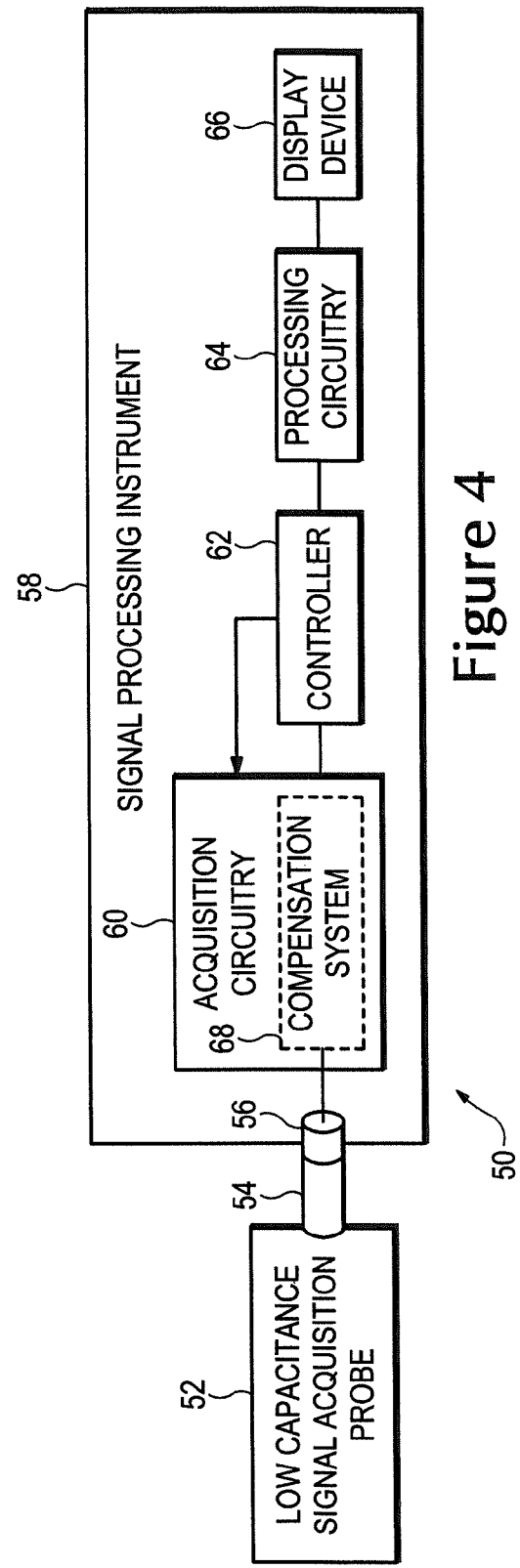
FIG. 4 is a block diagram of a signal acquisition system according to the present invention.

Referring to FIG. 4, there is shown a high level block diagram of a signal acquisition system 50 having reduced probe loading of a device under test according to the present invention. The signal acquisition system 50 has a signal acquisition probe 52 that includes a resistive center conductor signal cable 54. The signal cable is coupled to an input node 56 of a signal processing instrument 58. The input node 56 is also coupled to acquisition circuitry 60 in the signal processing instrument 58. The acquisition circuitry 60 generates digital values of an input signal from the signal acquisition probe 52. The digital values of the input signal are coupled to a controller 62 for further processing. The controller 62 may couple the digital values to processing circuitry 64 for formatting the digital values and displaying the formatted digital values on a display device 66.

In traditional probe-oscilloscope systems, each stage of the signal path is compensated for a flat frequency and phase response. The oscilloscope is calibrated to provide a nominally flat frequency response. The signal acquisition probe is attached to the oscilloscope and the probe is calibrated using termination and compensation circuitry in the probe to produce a nominally flat frequency response relative to the oscilloscope input. The resulting probe-oscilloscope system has time constant matching of the signal acquisition probe and the oscilloscope input to produce a flat frequency response over the probe oscilloscope system bandwidth. In the present invention, the high frequency input impedance of the signal acquisition probe 52 at a device under test is increased by reducing the input capacitance of the signal acquisition probe 52. The resulting structure of the present invention mismatches the time constants of the probe tip circuitry of the signal acquisition probe 52 and the circuitry across the input node 56 of the signal processing instrument 58. A compensation system 68 in the acquisition circuitry 60 provides pole-zero pairs that flatten the frequency response of the signal acquisition system 50 resulting from the mismatched time constants.

Figure 5:
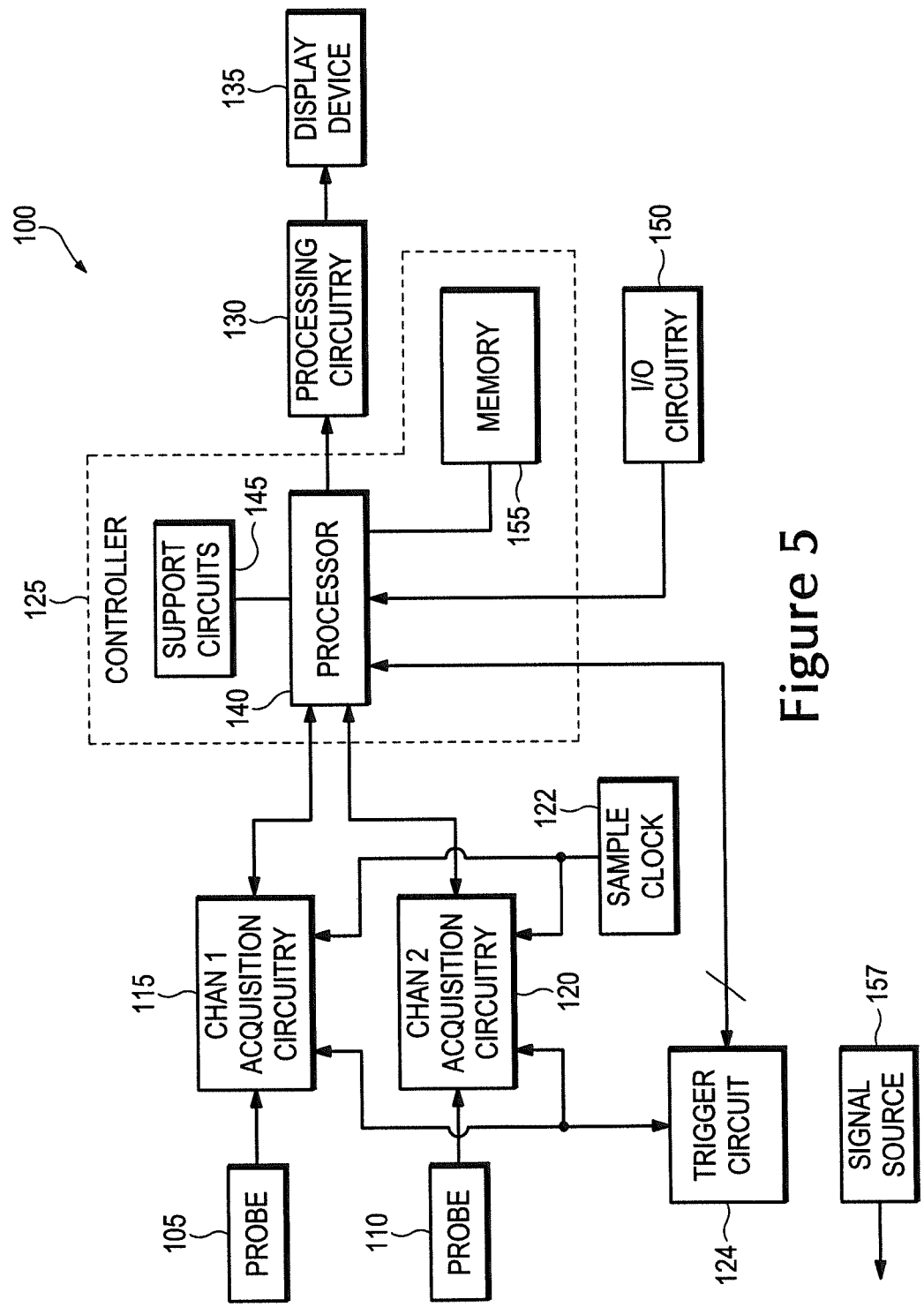
FIG. 5 is a representative block diagram of a signal processing instrument in a signal acquisition system according to the present invention.

The signal processing instrument 58 of the present invention, such as an oscilloscope, logic analyzer, digitizer and the like, will be described below with respect to a digital oscilloscope. FIG. 5 depicts a high level block diagram of a digital oscilloscope 100 used as part of the signal acquisition system 50 of the subject invention. Generally, oscilloscopes 100 include multiple signal channels with each signal channel having an input on which are connected various types of signal acquisition probes 105, 110, such as passive and active voltage probes, current probes, and the like, for acquiring electrical signals from a device under test (DUT). The oscilloscope 100 signal channel inputs are coupled to respective signal channel acquisition circuitry 115, 120. The respective acquisition circuitry 115, 120 sample their respective input signals in accordance with a sample clock provided by an internal sample clock generator 122.

The acquisition circuitry 115, 120 each include a preamplifier, analog-to-digital conversion circuitry, triggering circuitry, decimator circuitry, supporting acquisition memory, and the like. The acquisition circuitry 115, 120 operate to digitize, at a sample rate, one or more of the signals under test to produce one or more respective sample streams suitable for use by controller 125 or processing circuitry 130. The acquisition circuitry 115, 120, in response to commands received from the controller 125, changes preamplifier feedback values; trigger conditions, decimator functions, and other acquisition related parameters. The acquisition circuitry 115, 120 communicates its respective resulting sample stream to the controller 125.

A trigger circuit 124 is shown separate from the acquisition circuitry 115, 120 but one skilled in the art will realize that it could be internal to the acquisition circuitry 115, 120. The trigger circuit 124 receives trigger parameters, such as trigger threshold level, hold off, post trigger acquisition, and the like, from the controller 125 in response to user input. The trigger circuit 124 conditions the acquisition circuitry 115, 120 for capturing digital samples of the signal under test from the DUT.

The controller 125 operates to process the one or more acquired sample streams provided by the acquisition circuitry 115, 120 to generate respective sample stream data associated with one or more sample streams. That is, given desired time per division and volts per division display parameters, controller 125 operates to modify or rasterize the raw data associated with an acquired sample stream to produce corresponding waveform data having the desired time per division and volts per division parameters. The controller 125 may also normalize waveform data having non-desired time per division, volts per division, and current per division parameters to produce waveform data having the desired parameters. The controller 125 provides the waveform data to processing circuitry 130 for subsequent presentation on display device 135.

The controller 125 of FIG. 5 preferably comprises a processor 140, such as a PowerPC™ Processor, manufactured and sold by Motorola, Inc., Schaumburg, Ill., support circuits 145 and memory 155. Processor 140 cooperates with conventional support circuitry 145, such as power supplies, clock circuits, cache memory, buffer/expanders, and the like, as well as circuits that assist in executing software routines stored in memory 155. As such, it is contemplated that some of the process steps discussed herein as software processes may be implemented within hardware, for example, as circuitry that cooperates with processor 140 to perform various steps. Controller 125 also interfaces with input/output (I/O) circuitry 150. For example, I/O circuitry 150 may comprise a keypad, pointing device, touch screen, or other means adapted to provide user input and output to the controller 125. The controller 125, in response to such user input, adapts the operations of acquisition circuitry 115, 120 to perform various data acquisitions, triggering, processing, and display communications, among other functions. In addition, the user input may be used to trigger automatic calibration functions or adapt other operating parameters of display device 135, logical analysis, or other data acquisition devices.

Memory 155 may include volatile memory, such as SRAM, DRAM, among other volatile memories. Memory 155 may also include non-volatile memory devices, such as a disk drive or a tape medium, among others, or programmable memory, such as an EPROM, among others. A signal source 157 generates a broad frequency content signal for probe compensation. In the preferred embodiment of the present invention, the broad frequency content signal is a fast edge square wave. Alternately, the signal source 157 may be a leveled variable frequency sine-wave generator.

Although Controller 125 of FIG. 5 is depicted as a general purpose computer that is programmed to perform various control functions in accordance with the present invention, the invention may be implemented in hardware such as, for example, an application specific integrated circuit (ASIC). As such, it is intended that processor 125, as described herein, be broadly interpreted as being equivalently performed by hardware, software, or by a combination thereof.

Figure 6:
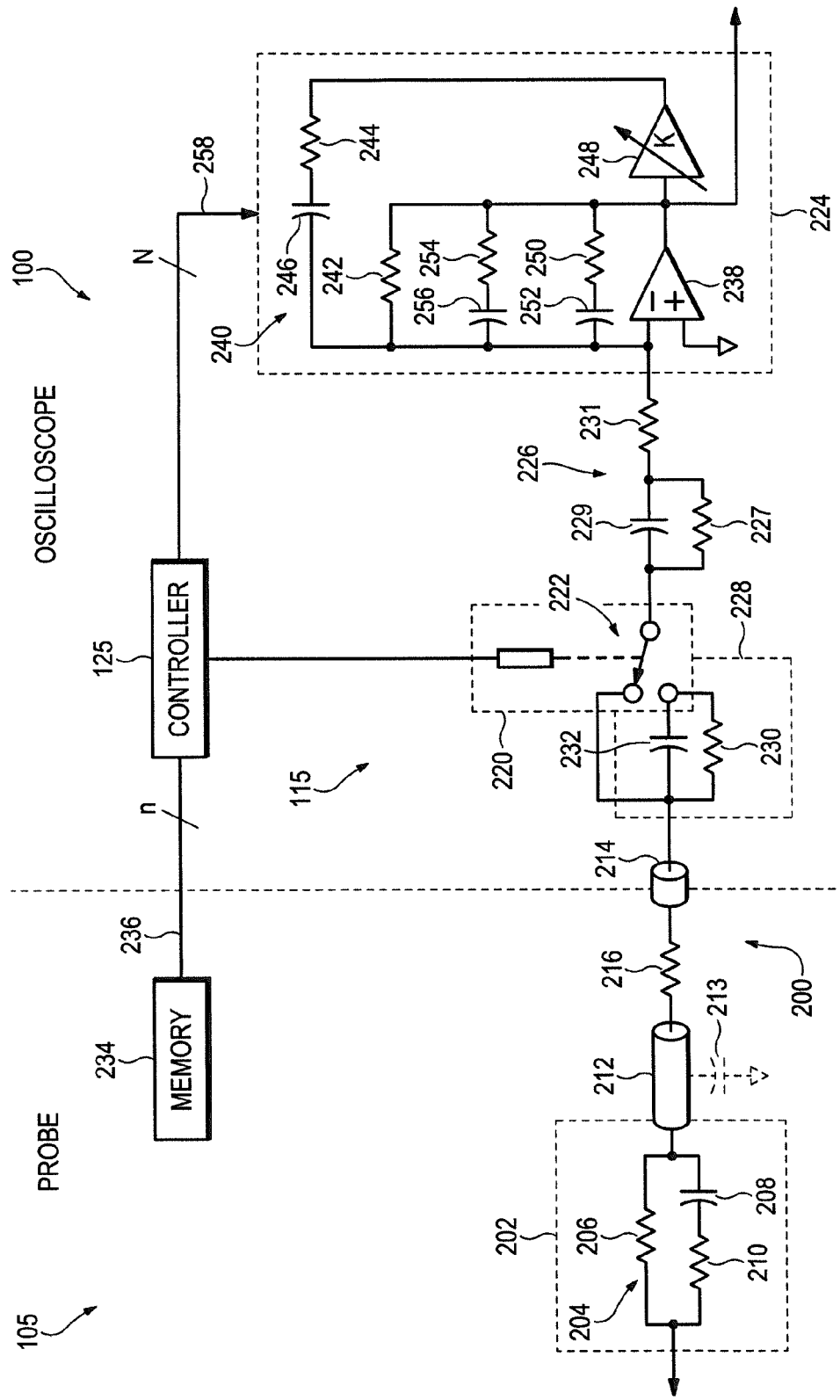
FIG. 6 is a representative schematic diagram of a signal acquisition system according to the present invention.

FIG. 6 is a representative schematic diagram of a signal acquisition system 200 according to the present invention. Like elements from FIG. 5 are labeled the same in FIG. 6. The signal acquisition probe 105 has a probing head 202 containing probe tip circuitry 204, a resistive center conductor signal cable 212, and a resistor element 216. The probe tip circuitry 204 has a resistive element 206 coupled in parallel with a capacitive element 208 that is in series with a resistive element 210. The capacitive element 208 has a capacitance in the range of 2-5 picofarads (pf) for a typical 10× probe to provide a low input capacitance to a device under test. The probe tip circuitry 204 is coupled to one end of the resistive center conductor signal cable 212. The other end of the resistive center conductor signal cable 212 is coupled to a BNC input node 214 of one of the signal acquisition circuitry 115, 120 in the digital oscilloscope 100 via the resistive element 216. The resistive center conductor signal cable is preferably a coaxial cable having a resistive center conductor with a resistance of 39 Ω/ft. The resistive center conductor signal cable 212 has a capacitance to ground, which is shown by capacitor 213. The BNC input node 214 is coupled to a switching circuit 220 which in turn provides coupling of the signal acquisition probe 105 to input circuitry 226. The resistive element 216 in combination with resistive element 231 in the input circuitry 226, representatively shown as attenuation circuitry consisting of resistive element 227 in parallel with capacitive element 229, terminate the resistive center conductor signal cable 212 in its characteristic resistive impedance. In the preferred embodiment of the invention, the termination capacitance of the resistive center conductor signal cable 212 is approximately 40 pf and the termination resistance is approximately 150Ω. In addition, a 1.2 meter resistive center conductor signal cable 212 has, by coincidence, a capacitance to ground of approximately 40 pf. The capacitance to ground of the resistive center conductor signal cable 212 can be easily changed by changing the length of the cable. The resistive element 216 has a resistive value of 100Ω and resistive element 231 has a resistive value of 50Ω. The resistive element 231 is physically located as close as possible to the input of input amplifier 238, functioning as a current amplifier, to reduce the non-terminated parasitic capacitance of the signal trace between the BNC input node 214 and the input amplifier 238. The BNC and signal trace here are assumed to be designed to a characteristic impedance of 50Ω so as to be properly terminated by resistive element 231. The input circuitry 226 also terminates the resistive center conductor signal cable 212 in its characteristic capacitive impedance.

The switching circuit 220 has a switching element 222 for selectively coupling the probe tip circuitry 204 to compensation system 224 via the input circuitry 226 or coupling an additional resistor-capacitor attenuation network 228, consisting of resistive element 230 in parallel with capacitive element 232, between the probe tip circuitry 204 and the input circuitry 226. The resistive-capacitive attenuator network 228 provides backward compatibility for legacy signal acquisition probes requiring a 1 MΩ oscilloscope input impedance. The switching element 222 is preferably a relay switch receiving switching commands from controller 125.

The signal acquisition probe 105 preferably has a memory 234 containing information about the probe, such as probe type, serial number, and the like, and may also contain probe calibration data. The probe memory 234 is preferably a one wire EEPROM, manufactured and sold by Maxim Integrated Products, Inc., Sunnyvale, Calif. under Part No. DS2431. The probe memory 234 is coupled to the controller 125 via a one line communications/power line 236. Alternately, the probe memory 234 may communicate with the controller 125 via multi line communications bus, such as an $I^2C$ bus, a Firewire bus or the like.

Moving the resistive and capacitive terminations of the resistive center conductor signal cable 212 into the signal processing instrument 100 substantially reduces the amount of mid-band and high-band frequency signal current being shunted to ground at the output of the resistive center conductor signal cable 212. In the prior art resistive center conductor signal cable passive voltage probes, a substantial portion, on the order of two-thirds of the mid-band and high-band signal current at the output of the probe cable, is shunted to ground by the termination capacitor in the probe compensation box depending on the termination capacitance of the cable and the parasitic capacitance of the oscilloscope input. Also, the resistive center conductor signal cable of the prior art is terminated in the compensation box of the probe which results in the parasitic capacitance in the input of the oscilloscope acting as a non-terminated stub, further shunting additional current to ground. In the present invention, the resistive and capacitive terminations in the input circuitry 226 are in series with the resistive center conductor signal cable 212 and the input of the input amplifier 238, resulting in substantially greater current flow into the input of the amplifier. The probe tip capacitance can be reduced to values in the range of 2-5 pf which reduces the mid-band and high-band frequency signal current at the output of the resistive center conductor signal cable 212. This decrease in signal current is offset by an overall increase in signal current provided to the input current amplifier resulting in a signal-to noise ratio equivalent to existing passive voltage probes. Additionally, the resistive element 231 terminating the signal path from the BNC input node 214 to the input amplifier 238 in conjunction with parasitic inductance and capacitance of the signal path essentially transforms the signal path into a terminated transmission line which further diminishes the amount of signal current shunted to ground. The results of moving the resistive and capacitive cable termination into the oscilloscope 100 and terminating the signal path in the instrument are that greater than fifty percent of the mid-band and high-band frequency signal current at the output of the resistive center conductor signal cable 212 is coupled to the input amplifier 238 and an increase in the bandwidth of the signal acquisition system due to the elimination of the non-terminated stub between the BNC input node 214 and the input amplifier 238.

The termination resistance and capacitance of the resistive center conductor signal cable 212 are fixed values for a given cable type where as the capacitance to ground of the resistive center conductor signal cable 212 varies with the length of the cable. In the preferred embodiment of the invention, the termination capacitance of the resistive center conductor signal cable 212 is approximately 40 pf and the termination resistance is approximately 150Ω. In addition, a 1.2 meter resistive center conductor signal cable 212 has, by coincidence, a capacitance to ground of approximately 40 pf. The capacitance to ground of the resistive center conductor signal cable 212 can be easily changed by changing the length of the cable. The resistive element 206 in the probe tip circuitry 204 has a value of 9.75 MΩ and the capacitive element 208 has a value of 3.4 pf. The capacitive value is lower than existing resistive center conductor passive voltage probes which generally have a capacitance in the range of 8 to 14 pf. Reducing the input capacitance at the probe tip reduces the capacitive loading of the device under test resulting in a wider probe bandwidth. The time constant for the probe tip circuitry 204 using the above values is 33.15 μsec. The time constant across the BNC input node 214 should match the time constant of the probe tip circuitry 204. Limitations are placed on the capacitive element 229 in the input circuitry 226 in that its capacitance should match the termination capacitance of the resistive center conductor signal cable 212. Therefore, the capacitance of capacitive element 229 is 40 pf. The capacitance to ground of the resistive center conductor signal cable 212, which is 40 pf, needs to added to the termination capacitance. The resulting capacitance at the BNC input node 214 is 80 pf. The probe tip circuitry 204 time constant is divided by the 80 pf value of the summed capacitive value of the termination capacitance and the capacitance to ground of the resistive center conductor signal cable 212 should result in a value of 414.4 kΩ for the resistive element 227 of the input circuit 226. However, the need for backward compatibility with legacy probes and a requirement to directly drive the oscilloscope input requires the oscilloscope input capacitance be in the range of 10-20 pf. The parasitic capacitance at the input of the oscilloscope is approximately 2 pf. The optimal value of the effective capacitance of the capacitive elements 229 and 232 is preferably between 10 and 12 pf. The value of capacitive element 229 is set at 40 pf to match the capacitance of the resistive center conductor signal cable 212. The value of capacitive element 232 needs to be approximately 13.3 pf to produce an effective capacitance of about 10 pf. The ratio of the capacitive element 229 to capacitive element 232 is 3:1 requiring a 1:3 ratio for the resistive element 227 and resistive element 230. The values of the resistive elements 227 and 232 need to add-up to 1 MD for backward compatibility resulting in the resistive element 227 having a value of 250 kΩ and the resistive element 232 having a value of 750 kΩ. The resulting time constants for the input circuitry 226 and the resistive-capacitive attenuator network 228 are 10 μsec. With the time constant of the input circuitry 226 set at 10 μsec, the time constant across the BNC input node 214 is nominally 20 μsec (80 pf times 250 kΩ) and the time constant of the probe tip circuitry 204 is 33.15 μsec. The compensation circuitry 224 has split pole-zero pairs that compensate for the mismatched time constants across the BNC input node of the oscilloscope 100.

The compensation system 224 has the input amplifier 238 functioning as a current amplifier with its inverting input coupled to the attenuation circuitry 226 via the termination resistor 231 and the non-inverting input coupled to ground. The input amplifier 238 of the compensation system 224 has feedback loop circuitry 240 that includes an adjustable feedback resistor 242, adjustable resistive and capacitive elements, and an adjustable gain element. The values of the adjustable resistors, capacitors, and gain element are controlled by changing register values of a plurality of registers. The feedback loop of resistive element 242 sets the DC and low frequency gain. Series feedback loops consisting of resistive element 250 and capacitive element 252 and resistive element 254 and capacitive element 256 are adjusted to form a split pair of poles and zeros. The total capacitance of the capacitive elements 252 and 256 set the midband gain and the parallel conductance of the resistive elements 250 and 254 set the high frequency gain. The time constant formed by pole and zero pair of elements 250 and 252 can be adjusted independently of the time constant formed by pole and zero pair of elements 254 and 256. The time constants are adjusted to provide flatness correction for that portion of the residual error caused by the mismatch of mid and high frequency gains in other portions of the circuit. The series feedback loop of resistive element 244, capacitive element 246 and a variable gain voltage source in the form of a variable gain amplifier 248 having a gain "K" affects the gain in a narrow band between the low and middle band frequencies that is adjusted to provide flatness correction for that portion of the residual error caused by the mismatch of low and mid frequency gains in other portions of the circuit. The controller 125 communicates with the feedback loop circuitry 240 via a four line Serial Peripheral Interface bus 258 for loading register values for the adjustable resistive, capacitive and gain elements.

Figure 7:
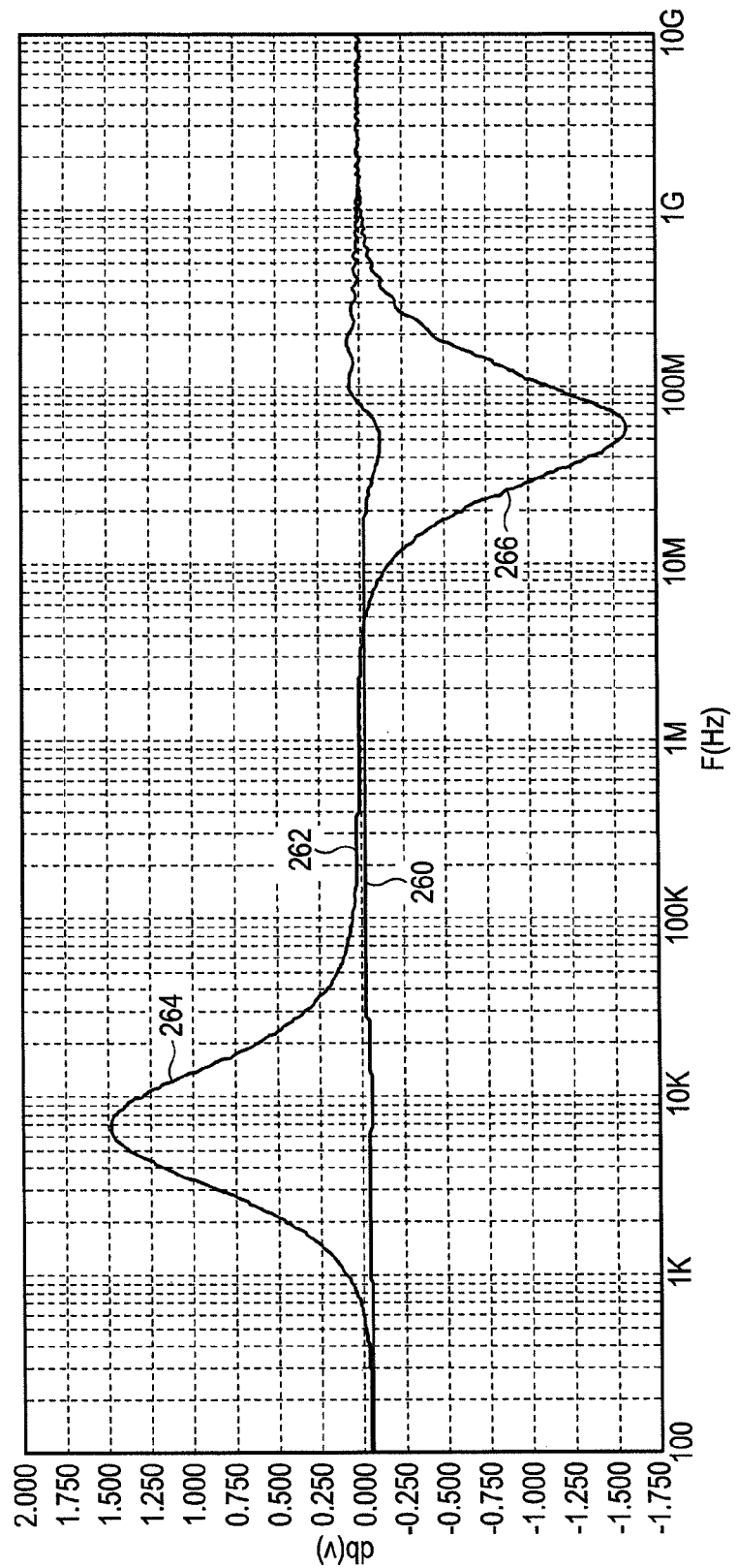
FIG. 7 shows representative frequency responses of a signal acquisition system with and without feedback crossover compensation.

FIG. 7 shows representative frequency responses 260, 262 of the signal acquisition system 200 with and without feedback crossover compensation. The capacitance of the capacitive element 208 in the probe tip circuitry 204 of the signal acquisition system 200 is reduced which increases the high frequency input impedance. The reduced capacitance in the probe tip circuitry 204 results in a time constant that is mismatched across the input node 214 with the time constant of the capacitance to ground capacitor 213 of the resistive center conductor signal cable 212 in combination with the input circuitry 226. This breaks the traditional probe-oscilloscope structure where each stage of the signal path is compensated for flat frequency and phase response. The mismatched time constants produce a peak 264 near 8 KHz. A valley 266 near 60 MHz in the frequency response 262 is related to the round-trip reflections in the resistive center conductor signal cable 212 resulting from the termination elements, resistive elements 216 and 231 and capacitive element 229, being only approximations for the complex impedance of the resistive center conductor signal cable 212. The feedback loop circuitry 240 provides feedback crossover compensation to the peak 264 and valley 266. The 8 KHz peak 264 is corrected in the feedback loop circuitry 240 of the input amplifier 238 by changing register values for any two of the adjustable resistive element 244, adjustable capacitive element 246, and the gain "K" of the variable gain amplifier 248. The valley 266 near 60 MHz is caused by the capacitance of the capacitive element 208 being lower than the capacitance of the same capacitor in the traditional probe, and is corrected by changing register values for capacitive elements 252 and 256 with resistive elements 250 and 254 forming a split pair of poles and zeros. The total capacitance of capacitive elements 252 plus 256 sets the midband gain (10 KHz to 10 MHz), and the parallel conductance of resistive elements 250 and 254 sets the gain above 200 MHz.

The resistive element 244 and the capacitive element 246 in the feedback loop of the input amplifier 238 produce a pole-zero pair in the signal acquisition system 200 that generates enough degrees of freedom that the peak 264 near 8 KHz in the frequency response can be flattened. The addition of a pole-zero pair in the feedback loop in series with the arbitrary gain "K" can cancel either a peak or a valley by setting "K" to be either positive or negative. The transfer function for the low frequency band (DC to mid band AC) is shown by Equation 1 below:

$$H(j\omega) = -\left(\frac{R_{242} \cdot (C_Z \cdot A_Z \cdot T_Z)}{TA_P \cdot C_P}\right) \quad \text{EQ. 1}$$

where
$C_Z$ represents the Correction Zero:
$(C_{246} \cdot R_{244} \cdot j\omega + 1)$
$A_Z$ represents the Attenuator Zero:
$(C_{229} \cdot R_{227} \cdot j\omega + 1)$
$T_Z$ represents the Tip Zero:
$(C_{208} \cdot R_{206} \cdot j\omega + 1)$
$C_P$ represents the Correction Poles:

$$\left(\begin{array}{c}(C_{252}+C_{256}) \cdot R_{242} \cdot j\omega \cdot C_{246} \cdot R_{244} \cdot j\omega + C_{246} \cdot K \cdot R_{242} \cdot j\omega + \\ (C_{252}+C_{256}) \cdot C_{246} \cdot R_{242} \cdot R_{244} \cdot (j\omega)^2 + 1\end{array}\right)$$

$TA_P$ represent the Tip/Attenuator Pole:
$(R_{227}+R_{206}+C_{212} \cdot R_{227} \cdot R_{206} \cdot j\omega + C_{229} \cdot R_{227} \cdot R_{206} j w + C_{208} \cdot R_{227} \cdot R_{206} j\omega)$ This $3^{rd}$ order system has enough degrees of freedom to line up all three poles with all three zeros by adjusting those components within the feedback loop circuitry 240, thus allowing an arbitrary mismatch of time constants on either side of the input node 214. The component values for $R_{244}$, $C_{246}$, or "K" can be solved if one of them is set. For most practical values, setting the location of the Correction Zero "$C_i$" on the real axis of a pole-zero map equal to the location of the Tip/Attenuator Pole "$TA_P$" yields the value for $R_{244}$ if $C_{246}$ is set, or for $C_{246}$ if $R_{244}$ is set. Factoring the Correction Poles "$C_P$" equation and setting the lower of the two poles equal to the Tip Zero "$T_Z$" yields the value of "K" depending on the solved values for $R_{244}$ and $C_{246}$. Alternately, factoring the Correction Poles "$C_P$" equation using the higher solved pole equal to the Attenuator Zero "$A_Z$" yields the value of "K".

The transfer function for the midband AC to high frequency AC is shown by Equation 2 below:

$$H(j\omega) = -\left(\frac{A}{B+C}\right) \quad \text{EQ. 2}$$

where A equals:

$$\frac{1}{\left(\dfrac{1}{\left(R_{250}+\dfrac{1}{C_{252}j\omega}\right)} + \dfrac{1}{\left(R_{254}+\dfrac{1}{C_{256}j\omega}\right)}\right)}$$

B equals:

$$\left(R_{216}+R_{231}+\frac{1}{C_{229}j\omega}\right) \cdot \left[\cos(\beta \cdot l) + Y_0 \cdot j \cdot \sin(\beta \cdot l) \cdot \left(R_{210}+\frac{1}{C_{208}j\omega}\right)\right]$$

C equals:

$$\cos(\beta \cdot l) \cdot \left(R_{210}+\frac{1}{C_{208}j\omega}\right) + Z_0 \cdot j \cdot \sin(\beta \cdot l)$$

and $$\beta = \omega \cdot \sqrt{LC} \; ; \; Z_0 = \sqrt{\frac{R+j \cdot \omega \cdot L}{G+j \cdot \omega \cdot C}} \; ; \; Y_0 = \frac{1}{Z_0};$$

l=electrical length of the cable.

The analysis to determine the transfer function through the cable at midband AC to high frequency AC uses 2-port microwave theory, specifically the ABCD, or transmission matrix. The use of the transmission matrix allows the use of measured data for the cable, since S-parameters can be easily transformed into T-parameters. The transfer function is built up by solving for the port voltages. The 2-port method easily solves the transfer function of the probe tip, cable and attenuator. The active circuit in the signal acquisition system 200 is solved by summing the current at the summing node and assuming an ideal operational amplifier for the input amplifier 238.

The transfer function of Equation 2 indicates that the time delay of the cable causes a pole split between the probe time constant and the attenuator time constant. Traditionally, this pole split is compensated for by choosing values for the probe circuitry time constant that set the poles atop of one another. This has been accomplished using network circuitry in the compensation box at the other end of the probe cable. However, this is at odds with the signal acquisition system 200 concept where the load capacitance in the probe tip circuitry 204 is reduced by lowering the probe tip capacitance and the probe compensation circuitry resides in the signal acquisition system.

The poles may be lined up with each other by increasing the tip resistance but this causes the overall frequency response of the probe-signal processing instrument system to suffer. Other traditional solutions to resolving the midband frequency response flatness requires adjusting cable parameters or removing capacitance in the attenuator to adjust the attenuator time constant. Removing too much capacitance in the attenuator causes the noise gain of the system to suffer and the input amplifier 238 is required to have a higher gain bandwidth. The present invention adds a pole-zero pair in the transfer function to compensate for the split poles by splitting the pole-zero pair in the feedback loop circuitry 240 into two pole-zero pairs (capacitive elements 252, 256 and resistive elements 250 and 254).

The above analysis of the transfer functions for the low frequency band (DC to mid band AC) and the midband AC to high frequency AC assumes that there are no parasitic capacitances or inductances and the input amplifier 238 is an ideal amplifier with infinite gain-bandwidth. The resistive elements 210, 231, 250 and 254 in the Equation 2 for the midband AC to high frequency AC are damping resistors in series with the respective capacitive elements 208, 229, 252 and 256. It is assumed at these frequencies (midband AC to high frequency AC) that the conductance of the capacitive elements 208, 229, 252 and 256 is much higher than the large DC resistive elements 206, 227 and 242, resulting in the midband range transfer function being a function of capacitance ratios of 208, 229, 252 and 256.

It should be understood that there will be poles due to parasitics and high frequency losses due to skin effects on the cable, as well as zeros from inductive peaking in the ground lead and the various interconnects in the system 200. The input amplifier 238 will have a finite bandwidth and non-zero phase delay. These additional effects will need to be considered in a final design and will affect the chosen component values for the system 200.

Active compensation of the signal acquisition system 200 of the present invention is achieved by electronically varying register values of the resistive and capacitive elements and the gain "K" of the variable voltage amplifier in the feedback loop circuitry 240 of the input amplifier 238. The probe memory 234 may be loaded with typical values associated with a signal acquisition probe, such as input resistance, attenuation factor, dynamic range, bandwidth, host resistance, and the like. The probe memory 234 may also be loaded with calibration constants associated with that particular probe at the time of factory calibration. The calibration constants are register values that are combined with existing register values in the feedback loop circuitry 240 of the input amplifier 238.

The broad frequency content signal from the signal source 157 is provided internally to at least one of the signal channels of the oscilloscope 100 during factory calibration. The broad frequency content signal is characterized and stored in oscilloscope memory 155 as a CAL REFERENCE WAVEFORM. The characterized waveform may be digitized magnitude values of the broad frequency content signal at selected time locations. Alternately, the characterized waveform may be stored as a time domain mathematical expression associated with amplitude, offset, rise time, overshoot aberrations and the like that would generate a digital waveform of the CAL REFERENCE WAVEFORM. A further alternative is characterizing the CAL REFERENCE WAVEFORM in the frequency domain by performing a Fast Fourier Transform (FFT) on the acquired digital time domain data of the broad frequency content signal.

The oscilloscope memory 155 is loaded with a series of time specific measured error factor tables. Each table defines a time location from a reference time location on the CAL REFERENCE WAVEFORM. Each table has a measured error field and a measured error factor field with each record of the measured error field having a corresponding record in the measured error factor field. Alternately, the oscilloscope memory 155 may be loaded with a series of frequency specific measured error factor tables where the digital data of the broad frequency content signal has been converted to the frequency domain using an FFT. Each table defines a frequency location on the CAL REFERENCE WAVEFORM. Each table has a measured error field and a measured error factor field with each record of the measured error field having a corresponding record in the measured error factor field. Additionally, multiple specific times error factor tables may be stored in the oscilloscope memory 155. These tables contain multiple time locations from the reference time. The tables have combinations of time locations and associated measured error fields, and a measured error factor field.

Figure 8A:
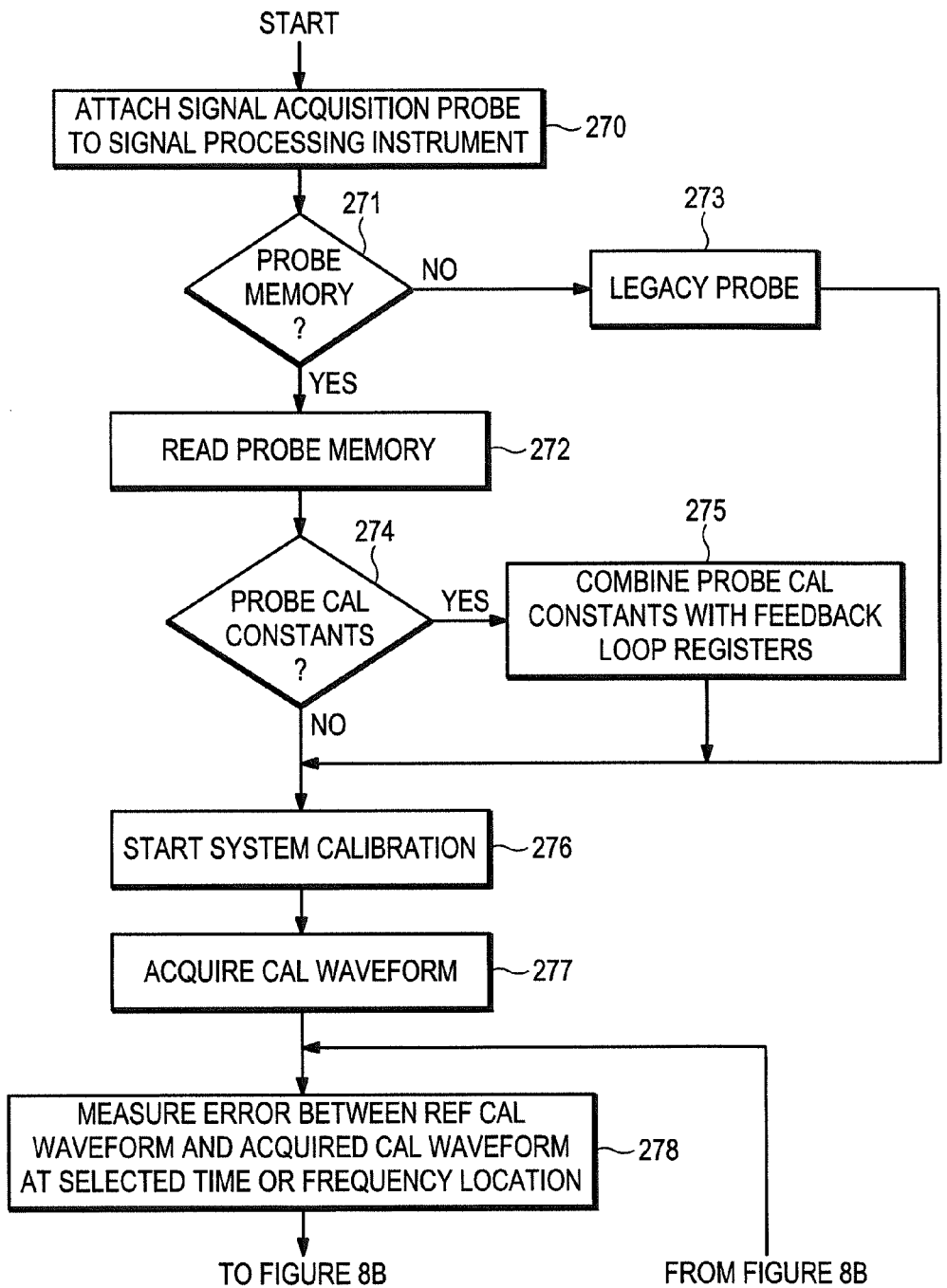
FIGS. 8A and 8B show a calibration process flow chart for calibrating a signal acquisition system of the present invention.
Figure 8B:
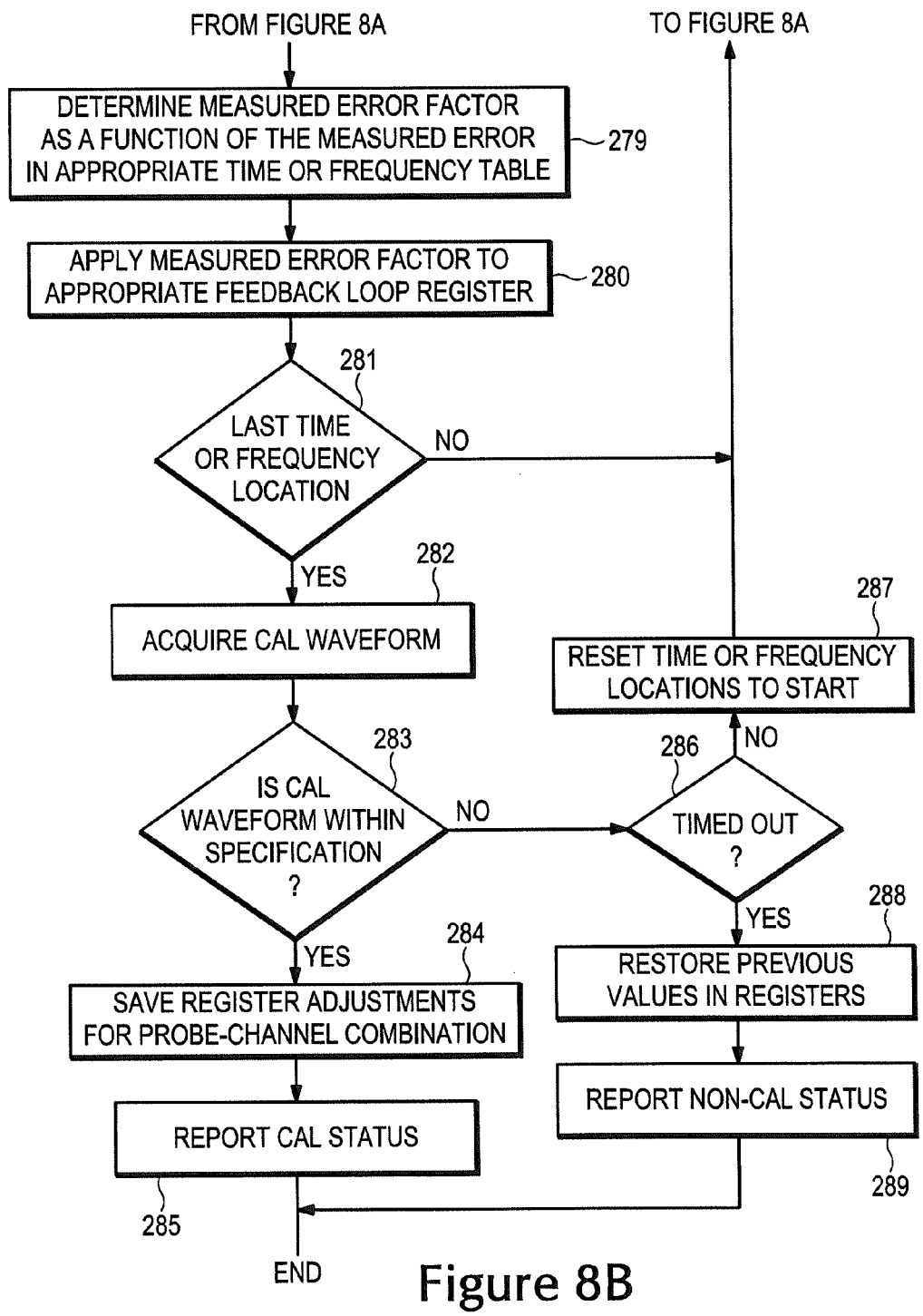

FIGS. 8A and 8B show a calibration process flow chart for calibrating the signal acquisition system 200 of the present invention. Prior to the calibration of the signal acquisition probe 105, DC signal path compensation is performed on the signal channel without the signal acquisition probe 105 attached. The signal acquisition probe 105 is attached to one of the signal channels of the oscilloscope 100 at step 270. The oscilloscope 100 detects the presence of a signal acquisition probe memory 234 at step 271 and reads the contents of the probe memory 234 at step 272. If the oscilloscope 100 does not detect the presence of a signal acquisition probe memory 234, then the attached probe is identified as a legacy probe at step 273. If the probe memory 234 has probe calibration constants as depicted at step 274, then the probe calibration constants are combined with the registers values of the feedback loop circuitry 240 of the input amplifier 238 at step 275.

A user connects the other end of the signal acquisition probe 105 to the broad frequency content signal source 157 and initiates the probe calibration on the signal channel at step 276 using the display device 135 and instrument controls that may include I/O circuitry, such as a keyboard, mouse or the like. The oscilloscope 100 acquires digital values of the broad frequency content signal as a CAL WAVEFORM at step 277. Alternately, the acquired digital values of the broad frequency content signal may be converted to the frequency domain using an FFT. The error value between the acquired CAL WAVEFORM and the CAL REFERENCE WAVEFORM is measured at a selected time or frequency location as represented in step 278. Multiple error values between the acquired CAL WAVEFORM and the CAL REFERENCE WAVEFORM also may be measured at multiple selected time or frequency locations. The measured error factor tables are accessed in step 279 with the selected time or frequency table corresponding to the selected time or times or frequency or frequencies of the measured error value being used. The measured error factor corresponding to measured error value is applied to the register value of the appropriate feedback loop register at step 280. The measured error factor is preferably a value that is multiplied with the current register value of the feedback loop circuitry 240 to generate a new register value. At step 281, a determination is made if the measured error value is at the last time or frequency location of the CAL REFERENCE WAVEFORM. If the calibration process is not at the last time or frequency location of the CAL REFERENCE WAVEFORM, then the process returns to step 278 and the measured error value between the CAL WAVEFORM and the CAL REFERENCE WAVEFORM at the next selected time or frequency location is determined.

If the calibration process has determined the last measured error value between the CAL WAVEFORM and the CAL REFERENCE WAVEFORM, then a new acquisition of digital values of the broad frequency content signal is performed and the digital values are stored as the CAL WAVEFORM as shown in step 282. The just acquired CAL WAVEFORM is compared to calibration specifications to determine if the new CAL WAVEFORM is within the calibration specifications at step 283. The calibration specifications include verifying that the CAL WAVEFORM low frequency compensation measurements are within spec, the peak-to-peak short term aberrations are less than a set percentage within a set time span as compared to the CAL REFERENCE WAVEFORM, the peak-to-peak long term aberrations are less than a set percentage within a different set time span as compared to the CAL REFERENCE WAVEFORM, and the rise time is within a set time as compared to the CAL REFERENCE WAVEFORM. If the new CAL WAVEFORM meets the calibration specifications, the register values of the feedback loop circuitry 240 of the input amplifier 238 are saved for the specific probe and signal channel calibration as shown at step 284. The user is informed that the calibration process has passed by a display output on the display device 135 at step 285 and the calibration process ends.

If the new CAL WAVEFORM does not meet the calibration specification, then the current elapsed time of the calibration process is compared to a iteration time limit value at step 286. If the current elapsed time of the calibration process does not exceed the iteration time limit value, then the time or frequency location of the new CAL REFERENCE WAEFORM is reset to the start location at step 287 and the measured error values between the CAL REFERENCE WAVEFORM and the new CAL WAVEFORM are determined, the measured error factors are determined and the measured error factors are applied to the register values of the plurality of registers in the feedback loop circuitry 240 of the input amplifier 238. If the elapsed time of the calibration process exceeds the iteration time limit value, then the initial register values of the feedback loop circuitry 240 are set as the register values as shown in step 288. The initial register values may be the initial nominal values applied to the registers in the feedback loop circuitry 240 without any probe calibration or the previously calibrated register values if the probe and signal channel combination had been previous calibrated. The user is informed of the non-calibration status of the probe-channel combination by a display output on the display device 135 at step 289 and the calibration process ends.

Figure 9:
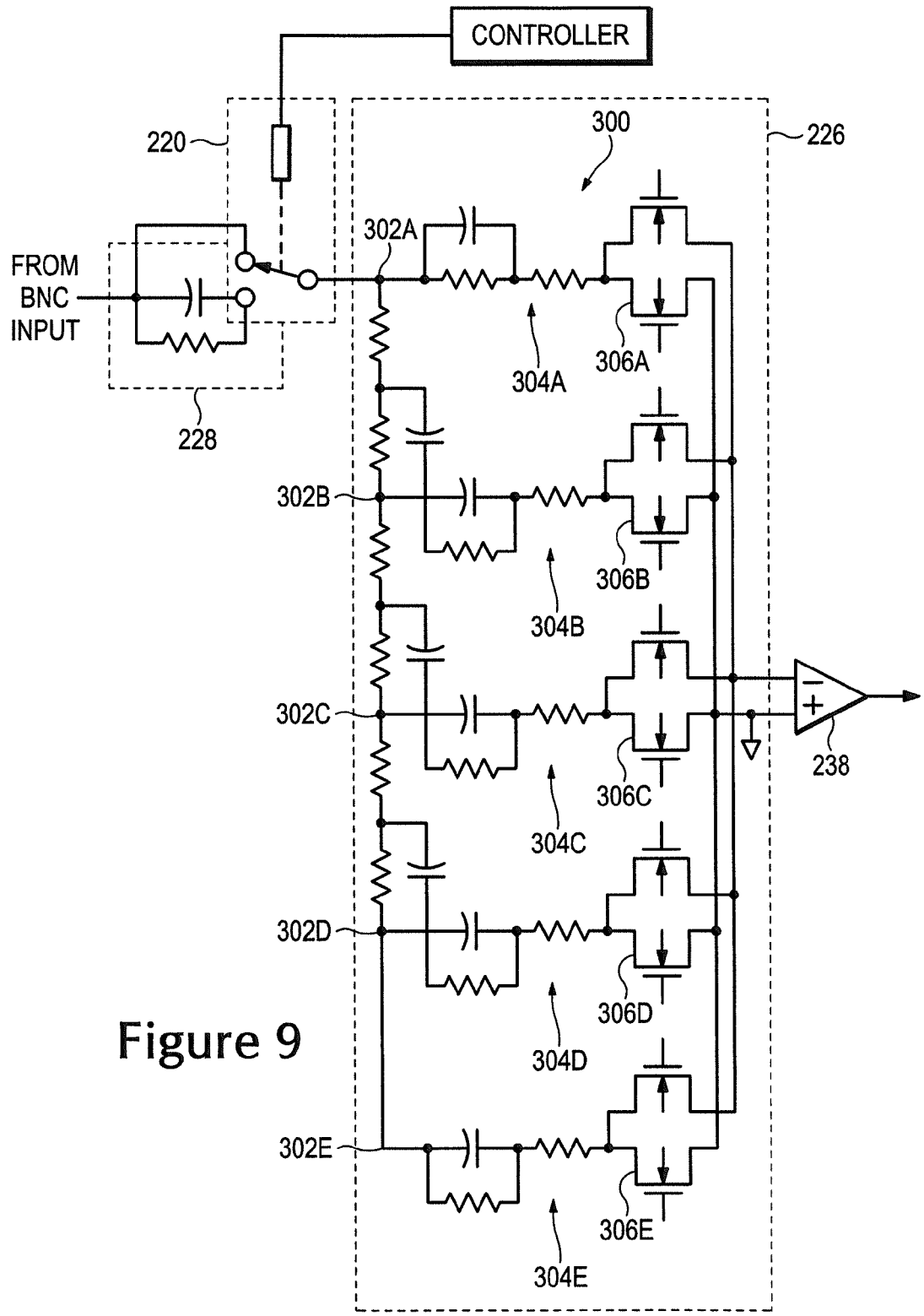
FIG. 9 is a representative schematic of the attenuator circuitry in a signal acquisition system of the present invention.

Referring to FIG. 9, there is shown a representative schematic diagram of the attenuation circuitry 226 as implemented in the signal acquisition system 200 of the present invention. The attenuator circuitry 226 is preferably a multi-stage attenuation ladder 300 with each attenuation stage having an input current node, 302A, 302B, 302C, 302D, 302E. In the preferred embodiment, the multi-stage attenuation ladder 300 has five stages 304A, 304B, 304C, 304D, 304E. The five attenuation stages are by example only and various numbers of stages may be implemented in the multi-stage attenuation ladder 300 without departing from the scope of the claimed invention. The input current to the multi-stage attenuation ladder 300 is received from the signal acquisition probe 105 via the BNC input 214. The input current is sequentially divided at each input current node, 302A, 302B, 302C, 302D, 302E, of each attenuation stage, 304A, 304B, 304C, 304D, 304E. A first portion of the current at each node is coupled through attenuation switches 306A, 306B, 306C, 306D, 306E to the input amplifier 238 or to ground and a remaining portion of the current coupled to the next attenuation stage.

For example, the input current entering the current input node 302A is divided so that three-fourths of the current is coupled through the first attenuation stage to the input amplifier 238 or to ground and one-fourth of the current is coupled to the input current node 302B of the next attenuation stage 304B. The one-fourth current entering the current input node 302B of the second attenuation stage 304B is divided so that three-sixteenths of the total input current to the multi-stage attenuation ladder 300 is coupled through the second stage 304B to the input amplifier 238 or to ground and one-sixteenth is coupled to the input current node 302C of the next attenuation stage 304C. The one-sixteenth current entering the current input node 302C of the third attenuation stage 304C is divided so that three-sixty-fourths of the total input current to the multi-stage attenuation ladder 300 is coupled through the third stage 304C to the input amplifier 238 or to ground and one-sixty-fourth is coupled to the input current node 302D of the next attenuation stage 304D. The one sixty-fourth current entering the input current node 302D is divided so that one-half of the current is coupled through the fourth stage 304D to the input amplifier 238 or to ground and one-half is coupled through the fifth stage 304E to the input amplifier 238 or to ground.

Vertical gain settings input by a user are interpreted by the controller 125 for activating and deactivating the attenuation switches 306A, 306B, 306C, 306D, 306E. The current through each of the attenuator stages 304A, 304B, 304C, 304D, 304E may be individually coupled to the input of the input amplifier 238 or the current through multiple stages may be combined and applied to the input of the input amplifier 238. The input current is not coupled to the input amplifier 238 when implementing "ground" coupling. The attenuation circuitry 226 scales the current to the dynamic range of the input amplifier 238.

Figure 1:
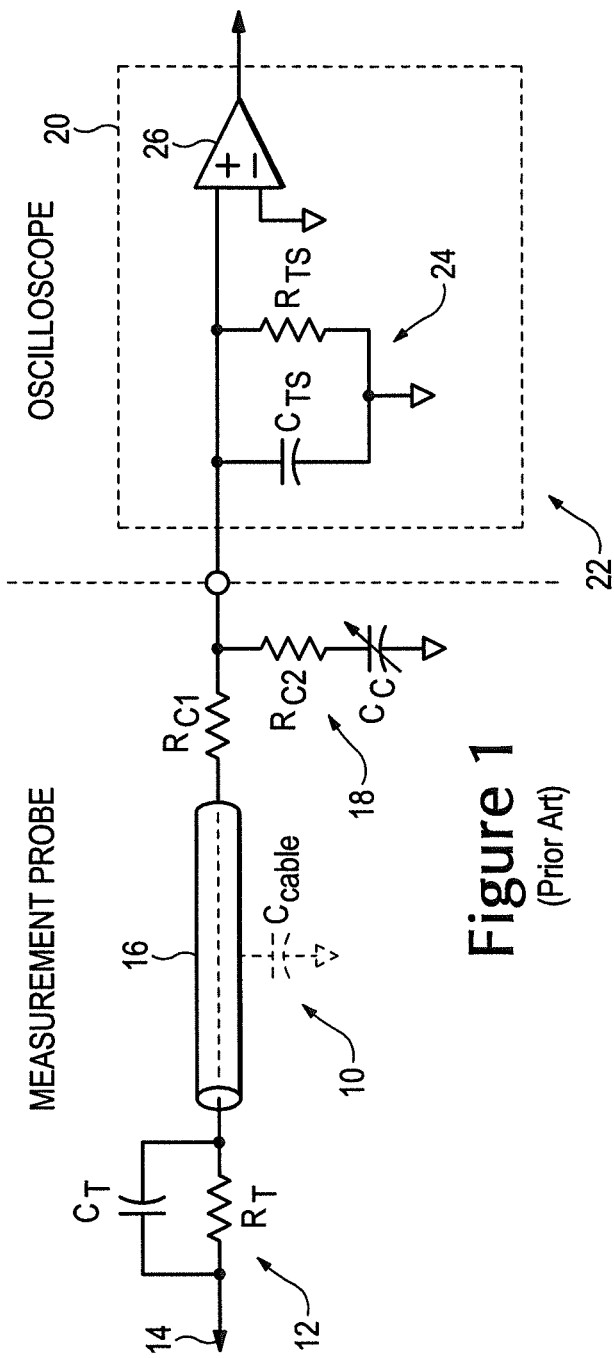
FIG. 1 is a representative schematic diagram of a prior art passive probe.
Figure 2:
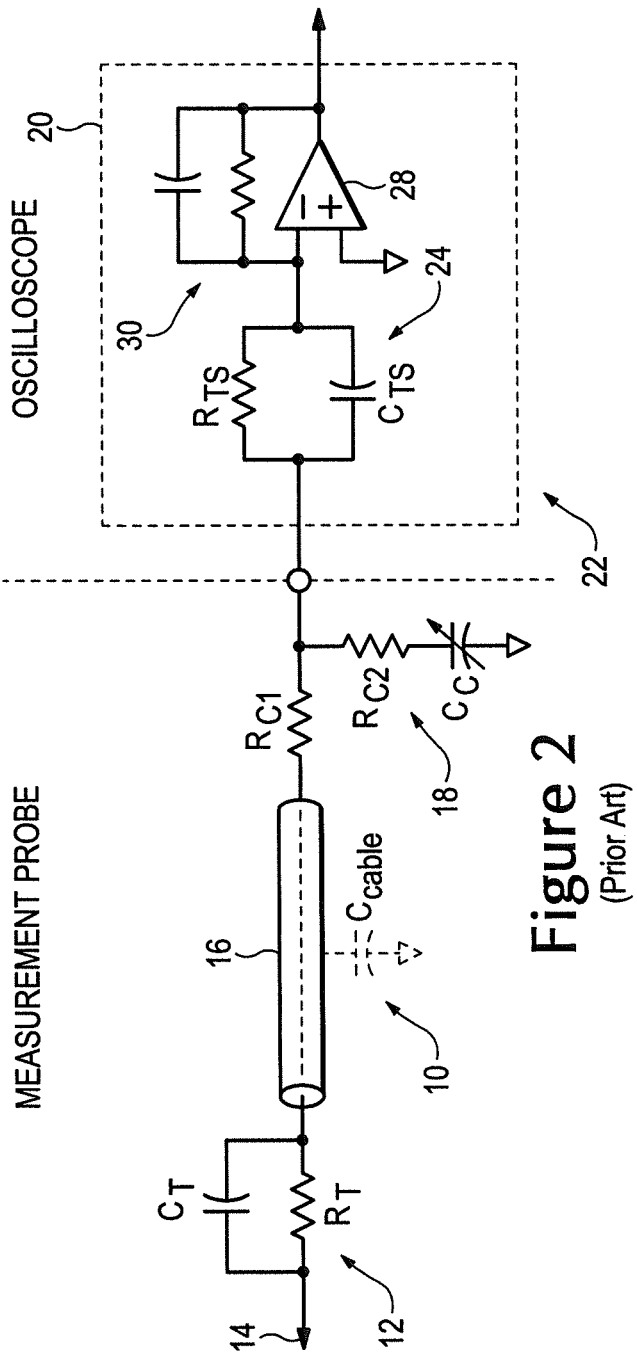
FIG. 2 is representative schematic diagram of another prior art probe circuit.
Figure 3:
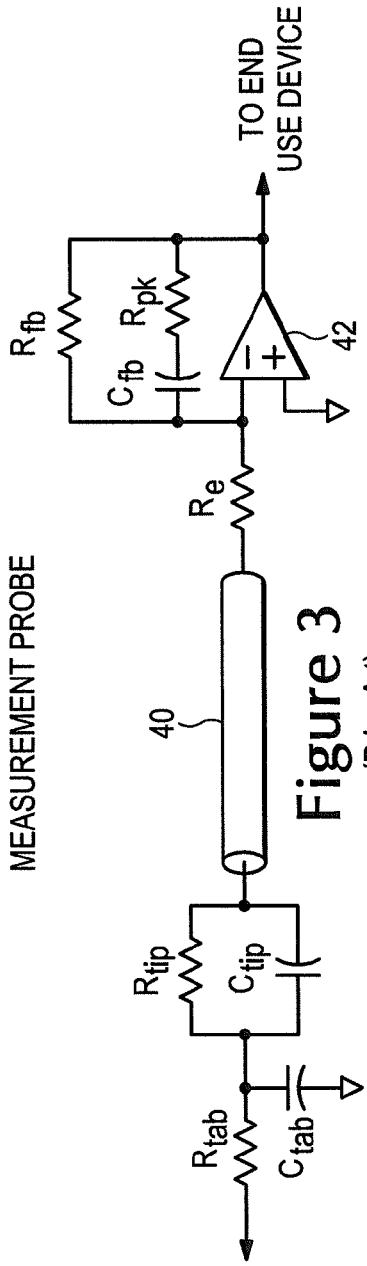
FIG. 3 is representative schematic diagram of a further prior art probe circuit.

The input impedance of the attenuator circuitry 226 for the signal acquisition system 200 is lower than expected by existing passive voltage probes. The shunt impedance of the compensation circuitry 18 in the compensation box of the prior art probe as illustrated in FIG. 1 is now a series impedance in the signal acquisition system 200. The addition of the selectable resistive-capacitive attenuator network 228 in series with the signal acquisition probe 105 and the attenuation circuitry 226 increases the input resistance and lowers the input capacitance of the oscilloscope to allow legacy passive voltage probes to be used with the signal acquisition system 200.

Figure 10:
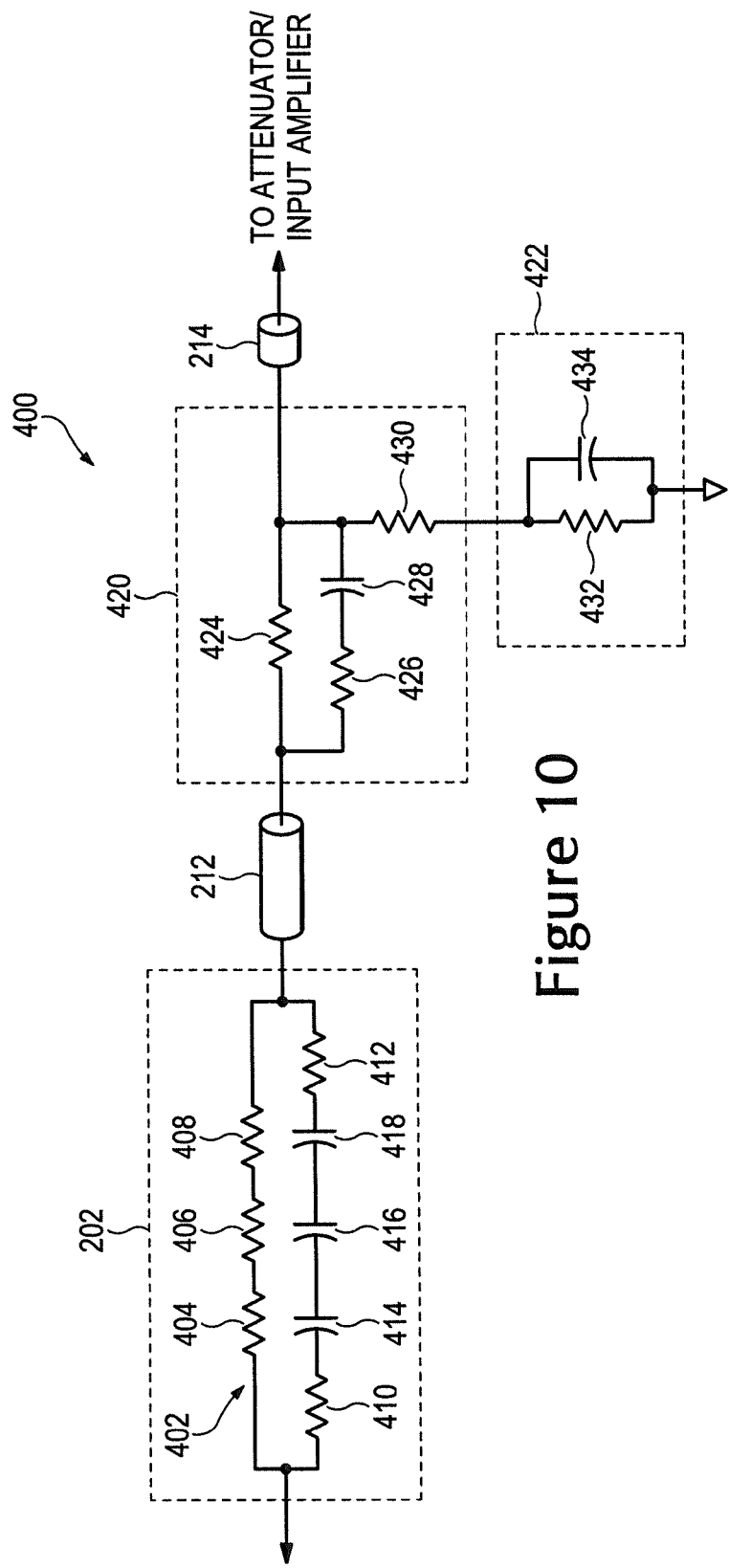
FIG. 10 is a schematic representation of a high voltage signal acquisition probe in a signal acquisition system of the present invention.

Referring to FIG. 10, there is shown a schematic representation of the signal acquisition probe 105 implementing a high voltage probe 400 for the signal acquisition system 200. The high voltage probe 400 has a probing head 202 containing probe tip circuitry 402. The probe tip circuitry 402 has a plurality of series connected resistive elements 404, 406, 408 coupled in parallel with series connected resistive elements 410 and 412 and capacitive elements 414, 416 and 418. The probe tip circuitry is coupled to one end of the resistive center conductor signal cable 212 with the other end of the signal cable 212 coupled via signal cable termination circuitry 420 to shunt attenuation circuitry 422 and the BNC input 214 of one of the signal acquisition circuitry 115. The cable termination circuitry 420 has resistive element 424 coupled in parallel with resistive element 426 and capacitive element 428 which are in series with resistive element 430. The shunt attenuation circuitry 422 has a resistive element 432 in parallel with a capacitive element 434. The shunt attenuation circuitry 422 functions as a portion of a voltage divider network with the probe tip circuitry 402. In a preferred embodiment, the total series resistance of the probe tip circuitry 402 is approximately 40 MΩ and the shunt resistive element 432 is 1 MΩ which results in a divide by ratio of 40:1 and a total attenuation factor from the probe tip circuitry 402 to the output of the input amplifier 238 of 50 times the selected attenuation factor of the attenuation circuitry 226. The voltage divider network of the probe tip circuitry 402 and the shunt attenuation circuitry 422 reduces the high voltage potential at the output of the coaxial cable 212 to provide a safety factor for a user. The resistive center conductor signal cable 212 has dielectric and skin effect losses which may be compensated for by the resistive element 426 and the capacitive element 428 in parallel with the resistive element 424.

Figure 11:
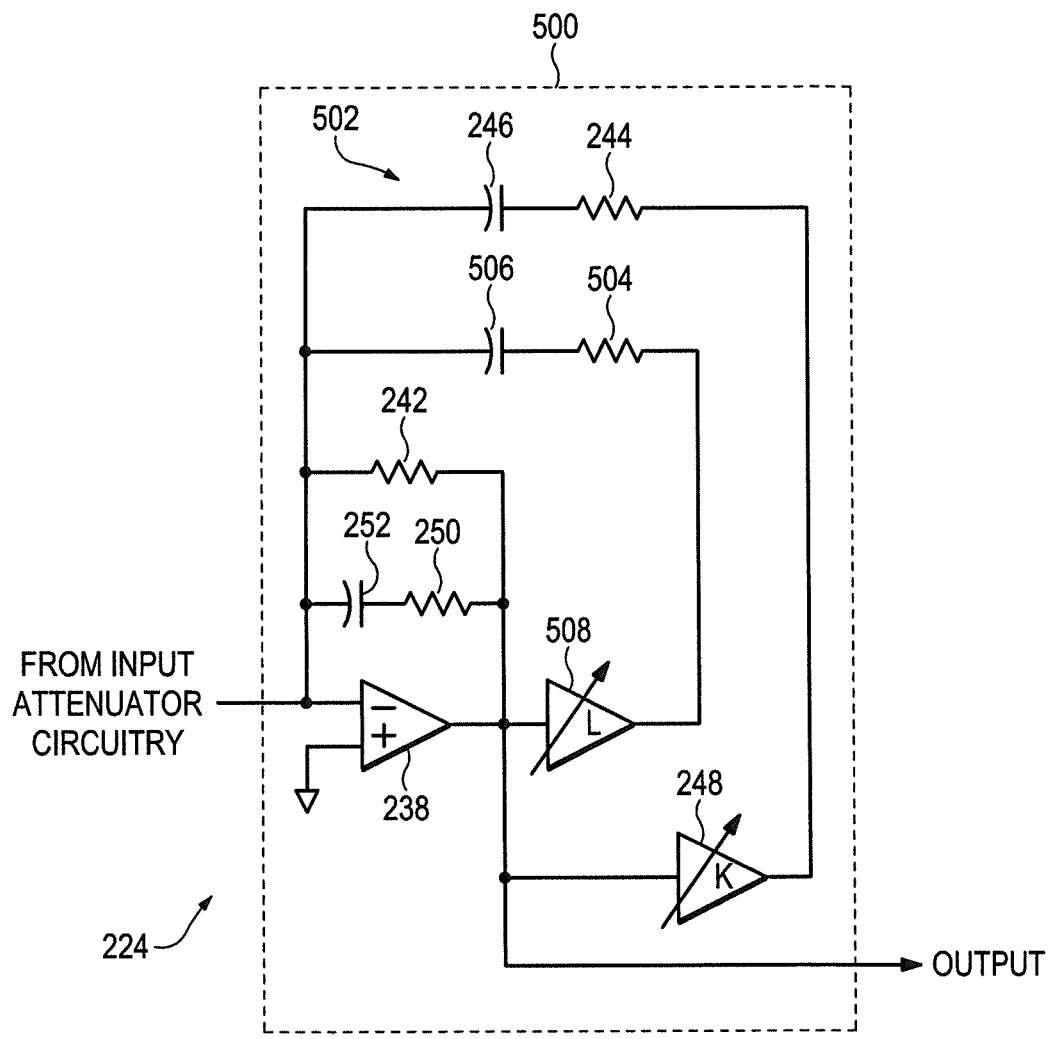
FIG. 11 is an alternate embodiment of a signal acquisition system of the present invention.

The signal acquisition system 200 has been described using a compensation system 224 having an input amplifier 238 and feedback loop circuitry 240 that includes split pairs of poles and zeros, and a series feedback loop of resistive element 244, capacitive element 246 and a variable gain voltage source in the form of a variable gain amplifier 248 having a gain "K". Various alternative embodiments are contemplated with one alternative embodiment representatively shown in FIG. 11. The circuitry of the signal acquisition system 200 prior to the compensation system 224 is the same as in FIG. 6. Common elements from previous drawing figures are labeled the same in FIG. 11. The compensation system 224 of FIG. 6 is replaced with compensation system 500 in FIG. 11. The compensation system 500 has the input amplifier 238 and feedback loop circuitry 502 having a series feedback loop of resistive element 504, capacitive element 506 and a variable gain voltage source 508 in the form of a variable gain amplifier having a gain "L" replacing the resistive element 254 and capacitive element 256 in the feedback loop circuitry 240 of FIG. 6. The feedback loop containing resistive element 244, capacitive element 246 and the variable voltage gain source (K) 248 compensates the low band crossover 264 (FIG. 7) and the feedback loop containing resistive element 504, capacitive element 506 and the variable gain voltage source (L) 508 compensates the high band crossover 266 (FIG. 7). The addition of the second variable gain voltage source 508 provides another degree of freedom that allows the adjustment of the pole-zero pair using the gain "L" without varying the time constant of the series resistive and capacitive elements 504 and 506. The series feedback loop of the resistive and capacitive elements 504, 506 and the variable gain voltage source (L) 508 in conjunction with the series resistive element 250 and capacitive element 252 are adjusted to provide flatness correction for that portion of the residual error caused by the mismatch of mid and high frequency gains in other portions of the circuit.

The transfer function for the low frequency band (DC to mid band AC) is shown by Equation 3 below:

$$H(j\omega) = -\left(\frac{R_{242} \cdot (C_Z \cdot A_Z \cdot T_Z)}{TA_P \cdot C_P}\right) \quad \text{EQ. 3}$$

where $C_Z$ is the correction zero, $A_Z$ is the Attenuator Zero, $T_z$ is the Tip Zero, and $TA_P$ is the Tip/Attenuator Pole as defined in Equation 1, and $C_P$ is the Correction Poles given by:

$$\left(\begin{array}{c}(C_{252} + L \cdot C_{506}) \cdot R_{242} \cdot jw + C_{246} \cdot R_{244} \cdot jw + C_{246} \cdot K \cdot R_{242} \cdot \\ j\omega + (C_{252} + L \cdot C_{506}) \cdot C_{246} \cdot R_{242} \cdot R_{244} \cdot (jw)^2 + 1\end{array}\right)$$

This transfer function simplifies to the original embodiment equations when L is equal to 1 and $C_{506}$ represents the original $C_{256}$. This transfer function has enough degrees of freedom to compensate for mismatched time constants of the tip circuitry 204, resistive center conductor signal cable 212, and the attenuator circuitry 226 as did the Equation 1 of the original embodiment of FIG. 6.

The transfer function for the mid band AC to high frequency is essentially the same as Equation 2 where B and C are the same as in Equation 2 shown below:

$$H(j\omega) = -\left(\frac{A}{B+C}\right) \quad \text{EQ. 2}$$

A is modified to include "L" in the denominator:

$$\frac{1}{\left[\left(R_{250} + \frac{1}{C_{252}j\omega}\right) + \frac{L}{\left(R_{504} + \frac{1}{C_{506}j\omega}\right)}\right]}$$

When L is set to 1, "A" is equivalent to "A" in Equation 2.

As with the compensation system 224 of FIG. 6, the values of the adjustable resistors, capacitors, and gain elements are controlled by changing register values of a plurality of registers with the controller 125 loading register values for the adjustable resistive, capacitive and gain elements.

It will be obvious to those having skill in the art that many changes may be made to the details of the above-described embodiments of this invention without departing from the underlying principles thereof. For example, the input amplifier 238 is not limited to an inverting amplifier and a non-inverting amplifier may be used without departing from the scope of the claimed invention. Further, the compensation system 224 may be implemented with multi-stage amplifiers where one or more amplifiers provide gain and one or more amplifiers provide the feedback crossover compensation. Additionally, any compensation not performed in using the input amplifier 238 may be shifted several stages later in the signal path, such as after the single-ended-to-differential conversion or the variable gain stages. It should also be noted that steps in the calibration process for the signal acquisition system 200 need not be performed in the exact order as described and claimed, and variation in the order of the steps may be implemented without departing from the claims of the invention. Likewise, an iteration count rather than an elapsed time limit may be used to abort a non-converging calibration attempt. The present invention preferably uses registers for varying the resistive and capacitive values of the resistive and capacitive elements in the feedback loop circuitry of the compensation system. However, it is contemplated that by precise laser trimming of the resistive and capacitive components in the signal acquisition system that the use of registers in the feedback loop circuitry may not be needed. The scope of the present invention should, therefore, be determined only by the following claims.

The invention claimed is:

1. A calibration process for a signal acquisition system having a signal acquisition probe and a signal processing instrument comprising the steps of:
    a) acquiring digital values of a broad frequency content signal as a calibration waveform using the signal acquisition probe and the signal processing instrument;
    b) determining at least a first measured error value between a broad frequency content signal reference calibration waveform stored in the signal processing instrument and the calibration waveform at a common location on the waveforms set by at least one of a time location and a frequency location;

c) determining a measured error factor as a function of at least the first measured error value and the common location on the waveforms;

d) applying the measured error factor to a register value of an appropriate register in a plurality of registers in feedback loop circuitry of an input amplifier of a compensation system;

e) repeating steps b), c), and d) for additional common locations on the waveforms;

f) acquiring digital values of a broad frequency content signal as a calibration waveform using the signal acquisition probe and the signal processing instrument after determining the measured error value and measured error factor at the last common location on the waveform;

g) comparing calibration specifications with the calibration waveform acquired in step f) to verify the calibration waveform is within calibration specifications;

h) storing register values loaded in the plurality of registers in feedback loop circuitry of input amplifier for the calibration waveform within calibration specifications; and i) displaying successful result of the calibration process.

2. The calibration process for a signal acquisition system having a signal acquisition probe and a signal processing instrument as recited in claim 1 wherein the determining steps b) and c) further comprises the steps of:

a) determining a plurality of first measured error values between a broad frequency content signal reference calibration waveform stored in the signal processing instrument and the calibration waveform at common locations on the waveforms set by at least one of time locations and frequency locations; and b) determining a measured error factor as a function of the plurality of first measured error values and the common locations on the waveforms.

3. The calibration process for a signal acquisition system having a signal acquisition probe and a signal processing instrument as recited in claim 1 wherein the verifying step further comprises the steps of:

a) determining if the calibration process has exceeded an iteration time limit value;

b) setting the common location on the waveforms to the initial location when the calibration process has not exceeded the iteration time limit value; and c) repeating step e) for the common locations on the waveforms.

4. The calibration process for a signal acquisition system having a signal acquisition probe and a signal processing instrument as recited in claim 3 wherein the determining step of claim 3 further comprises the steps of:

a) storing initial register values in the plurality of registers in the feedback loop circuitry of the input amplifier prior to the start of the calibration process when the calibration process exceeds the iteration time limit value; and b) displaying unsuccessful result of the calibration process.

5. The calibration process for a signal acquisition system having a signal acquisition probe and a signal processing instrument as recited in claim 1 wherein the acquiring step of step a) further comprises the steps of:

a) attaching the signal acquisition probe to the signal processing instrument;

b) detecting at least one of the presence or absence of a probe memory in the signal acquisition probe by the signal processing instrument;

c) loading stored contents of probe memory into the signal processing instrument when the probe memory is present;

d) detecting probe calibration constants stored in the probe memory;

e) applying the probe calibration constants to appropriate register values in the plurality of registers in the feedback loop circuitry of the input amplifier; and f) identifying the signal acquisition probe as not having a probe memory when the probe memory is absent.

6. The calibration process for a signal acquisition system having a signal acquisition probe and a signal processing instrument as recited in claim 1 wherein the determining step of step b) further comprises the steps of:

a) converting the digital values of a broad frequency content signal calibration waveform to a frequency domain representation using a Fourier Transform; and b) determining a measured error value between a frequency domain representation of a broad frequency content signal reference calibration waveform stored in the signal processing instrument and the frequency domain representation of the calibration waveform at a common location on the waveforms set by a frequency interval.

* * * * *

UNITED STATES PATENT AND TRADEMARK OFFICE
CERTIFICATE OF CORRECTION

PATENT NO. : 8,723,530 B2  Page 1 of 1
APPLICATION NO. : 13/854566
DATED : May 13, 2014
INVENTOR(S) : Josiah A. Bartlett et al.

It is certified that error appears in the above-identified patent and that said Letters Patent is hereby corrected as shown below:

Specification

In column 3, line 6, replace "$R_{fp}$," with -- $R_{tip}$ --;
In column 3, line 8, replace "$C_f$," with -- $C_{fb}$ --;
In column 10, line 10-11, replace "1 MD" with -- 1 M$\Omega$ --;
In column 11, line 64, replace "$C_i$," with -- $C_z$ --.

Signed and Sealed this
Fifteenth Day of March, 2016

Michelle K. Lee
*Director of the United States Patent and Trademark Office*